United States Patent
Sato et al.

(10) Patent No.: US 7,760,472 B2
(45) Date of Patent: Jul. 20, 2010

(54) MAGNETIC SENSOR AND MAGNETIC RECORDING/REPRODUCING APPARATUS

(75) Inventors: Rie Sato, Kanagawa-ken (JP); Koichi Mizushima, Kanagawa-ken (JP); Kiwamu Kudo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 602 days.

(21) Appl. No.: 11/812,831

(22) Filed: Jun. 22, 2007

(65) Prior Publication Data

US 2008/0080100 A1   Apr. 3, 2008

(30) Foreign Application Priority Data

Sep. 28, 2006   (JP) .............................. 2006-265551

(51) Int. Cl.
*G11B 5/33*   (2006.01)
(52) U.S. Cl. ...................................... 360/324
(58) Field of Classification Search ............... 360/324, 360/324.1, 324.2
See application file for complete search history.

(56) References Cited

U.S. PATENT DOCUMENTS

| | | | | |
|---|---|---|---|---|
| 7,471,491 | B2 * | 12/2008 | Sato et al. | 360/313 |
| 7,602,588 | B2 * | 10/2009 | Sato et al. | 360/324 |
| 7,616,412 | B2 * | 11/2009 | Zhu et al. | 360/324.2 |
| 7,633,699 | B2 * | 12/2009 | Kaka et al. | 360/67 |
| 2006/0039089 | A1 * | 2/2006 | Sato | 360/324 |
| 2006/0221507 | A1 * | 10/2006 | Sato et al. | 360/324 |

FOREIGN PATENT DOCUMENTS

JP   2006-86508   3/2006

OTHER PUBLICATIONS

Kaka et al.; "Mutual Phase-Locking of Microwave Spin Torque Nano-Oscillators"; Nature, vol. 437, pp. 389-392, (2005).
Pufall et al.; "Electrical Measurement of Spin-Wave Interactions of Proximate Spin Transfer Nanooscillators"; Physical Review Letters, PRL 97, 087206, Week Ending Aug. 25, 2006, pp. 087206-1-087206-4, (2006).

* cited by examiner

*Primary Examiner*—Angel A. Castro
(74) *Attorney, Agent, or Firm*—Finnegan, Henderson, Farabow, Garrett & Dunner, L.L.P.

(57) ABSTRACT

A magnetic sensor includes a magnetic oscillation element whose oscillation frequency changes depending on the magnitude of an external magnetic field, and an oscillation element provided in the vicinity of the magnetic oscillation element and oscillating at an oscillation frequency close to that of the magnetic oscillation element. The magnetic oscillation element includes a first fixed magnetization layer whose magnetization is fixed, a first magnetization oscillation layer, a first non-magnetic layer provided between the first fixed magnetization layer and the first magnetization oscillation layer, and a pair of electrodes for passing current perpendicularly to the film surfaces of the first fixed magnetization layer, the first magnetization oscillation layer, and the first non-magnetic layer. These two elements are used in combination with the passed current to acquire a high frequency oscillation signal generated from the magnetic oscillation element and the oscillation element.

6 Claims, 14 Drawing Sheets

MAGNETIC SENSOR AND MAGNETIC RECORDING/REPRODUCING APPARATUS

CROSS-REFERENCE TO RELATED APPLICATIONS

This application is based upon and claims the benefit of priority from prior Japanese Patent Application No. 2006-265551, filed Sep. 28, 2006, the entire contents of which are incorporated herein by reference.

BACKGROUND OF THE INVENTION

1. Field of the Invention

The present invention relates to a magnetic sensor and a magnetic recording/reproducing apparatus utilizing a micro magnetic oscillation element.

2. Description of the Related Art

The recording density of magnetic recording media has been improving at a rate of 100% per year since the advent of GMR heads utilizing the giant magneto-resistive effect (GMR effect). A GMR element, such as GMR head, comprises a multi-layer film having a sandwich structure comprising a ferromagnetic layer, a non-magnetic layer, and another ferromagnetic layer. The GMR element utilizes the magneto-resistive effect of what is called a spin-valve film. The magnetization of one of the ferromagnetic layers is fixed by applying an exchange bias to the same, while the magnetization of the other ferromagnetic layer is varied by external magnetic fields. Any change in the relative angle between the directions of magnetization of the two ferromagnetic layers can be detected as a resistance change. Such GMR elements developed so far include CIP (Current-In-Plane) GMR elements in which a current is passed in the plane of a spin-valve film to detect a resistance change, and CPP (Current-Perpendicular-to-Plane) GMR elements in which a current is passed perpendicularly to the plane of a spin-valve film to detect a resistance change. Both of CIP GMR elements and CPP GMR elements have a magneto-resistance ratio (MR ratio) on the order of a few percents, and they are considered to allow a recording density of about 200 Gbits/inch$^2$.

TMR elements utilizing the tunneling magneto-resistive effect (TMR effect) are currently being developed to allow magnetic recording at still higher densities. A TMR element comprises a multi-layer film comprising a ferromagnetic layer, an insulation layer, and another ferromagnetic layer. A tunneling current is passed by applying a voltage between the ferromagnetic layers. The TMR element takes advantage of the fact that the magnitude of a tunneling current changes depending on the directions of magnetization of top and bottom ferromagnetic layers, so that a change in the relative angle between the magnetizations is detected as a change in tunneling resistance. TMR elements having a maximum MR ratio about 50% have become available. TMR elements provide signal magnitude (voltages or current) higher than those of GMR elements because they have higher MR ratios.

However, a higher signal magnitude results in an increase not only in pure signal components, but also in noise components attributable to shot noises. Therefore, the signal-to-noise ratio (SN ratio) becomes difficult to achieve. Shot noises are attributable to current fluctuations generated when electrons irregularly pass a tunnel barrier, and they increase in proportion to the square root of tunneling resistance. Therefore, the tunnel insulation layer must be made thin to reduce tunneling resistance in order to suppress shot noise so that the TMR element can obtain a required signal (voltage or current).

The size of TMR element must be reduced to be closer to the recording bit size in order to obtain higher recording density. It is therefore required to make the tunnel insulation layer thinner in order to reduct the junction resistance. For a recording density of 300 Gbits/inch$^2$, junction resistance must be 1 $\Omega \cdot cm^2$ or less, and a tunnel insulation layer having a thickness equivalent to two atomic layers must be formed in the case of an Al—O (aluminum oxide film) tunnel insulation layer. Such thin layer is drastically difficult to fabricate. Also On the other hand, the possibility of shorting between top and bottom electrodes and thus the danger of reduction in SN ratio becomes higher too. For the above-described reasons, the limit of the recording density by TMR elements is estimated at 300 Gbits/inch$^2$.

Any of the above-described elements utilizes magneto-resistive effects in a broad sense, and magnetic white noises commonly encountered in those elements is significant. Those noises become more dominant as elements become finer because they are attributable to thermal fluctuation of magnetization unlike electrical noises such as shot noise described above. It is assumed that white noises exceed electrical noises in elements which allow recording densities of 500 Gbpsi and higher.

The use of a micro magnetic oscillation element having sensitivity higher than that of GMR type elements according to Patent Document JP-A-2006-86508, is recently suggested for the purpose of avoiding magnetic white noises, and improving the recording density of magnetic recording further. However, a problem still remains in magnetic sensors utilizing such micro magnetic oscillation elements. A magnetic layer at a sensing part must be processed into dimensions on the order of the bit size of the recording medium (a thickness dimension corresponding to a bit width and an aperture width corresponding to a track width). Therefore, processing techniques for making an element in a fine pillar-like shape become more difficult to implement. Reduction in SN ratio attributable to magnetic thermal noises constitutes another problem.

SUMMARY OF THE INVENTION

The present invention was made in the light of the circumstances as described above, and it is an object of the invention to provide a magnetic sensor capable of detecting a magnetic field in a microscopic region, and suppressing reduction in the SN ratio attributable to magnetic thermal noises.

According to an aspect of the present invention, a magnetic sensor includes a magnetic oscillation element whose oscillation frequency changes depending on the magnitude of an external magnetic field, and an oscillation element. The magnetic oscillation element has a first fixed magnetization layer whose magnetization is fixed, a first magnetization oscillation layer, a first non-magnetic layer provided between the first fixed magnetization layer and the first magnetization oscillation layer, and a pair of electrodes for passing current perpendicularly to the film surfaces of the first fixed magnetization layer, the first magnetization-oscillation layer, and the first non-magnetic layer. The oscillation element is provided in the vicinity of the magnetic oscillation element, for oscillating at an oscillation frequency close to the oscillation frequency of the magnetic oscillation element. Wherein, the above current is used to acquire a high frequency oscillation signal between the magnetic oscillation element and the oscillation element.

Other and further objects of this invention will become obvious upon an understanding of the illustrative embodiments about to be describe or will be indicated in the

DESCRIPTION OF THE PREFERRED EMBODIMENTS

A mode for carrying out the invention will now be described in detail with reference to the drawings. In the following description, like parts will be indicated by like reference numerals to avoid duplication of description.

First Mode for Carrying Out the Invention

Firstly, a description will be made to underlie the improvement of the SN ratio, when the magnetic oscillation element is used as a magnetic sensor.

In order to improve the SN ratio of a magnetic sensor utilizing a magnetic oscillation element, it is important to reduce magnetic noises near the oscillation frequency. In general, the noise near the oscillation frequency is indicated by the width of oscillation spectra, what is called oscillation line width. Therefore, it is important to reduce oscillation line width attributable to non-uniformity of junction and also to thermally oscillating magnetic fields $h_{Ti}$ (i=x, y, z). The non-uniformity of junction results from two primary factors. The first factor is changes that occur during processing in magnetic characteristics of magnetic layer around a junction, such as the composition and anisotropic energy. The second factor is a complicated magnetic structure which is generated around a junction by magneto-static energy, even when there is no damage attributable to processing. Magnetic non-uniformity generated by those factors at a junction increases oscillation line widths. A thermally oscillating magnetic field is a random magnetic field generated by lattice vibration of magnetic layer, and the statistical mean square of the same is given by Expression 1 where α, M, and V represent the attenuation constant, saturation magnetization, and volume of a magnetic oscillation layer, respectively; k, T, and γ represent the Boltzmann constant, temperature, and gyro-magnetic ratio, respectively; and B represents a band width.

$$<h_{Ti}^2> = \frac{4\alpha kT}{\gamma MV}B, \quad i = x, y, z \quad \text{Expression 1}$$

Figure 1:
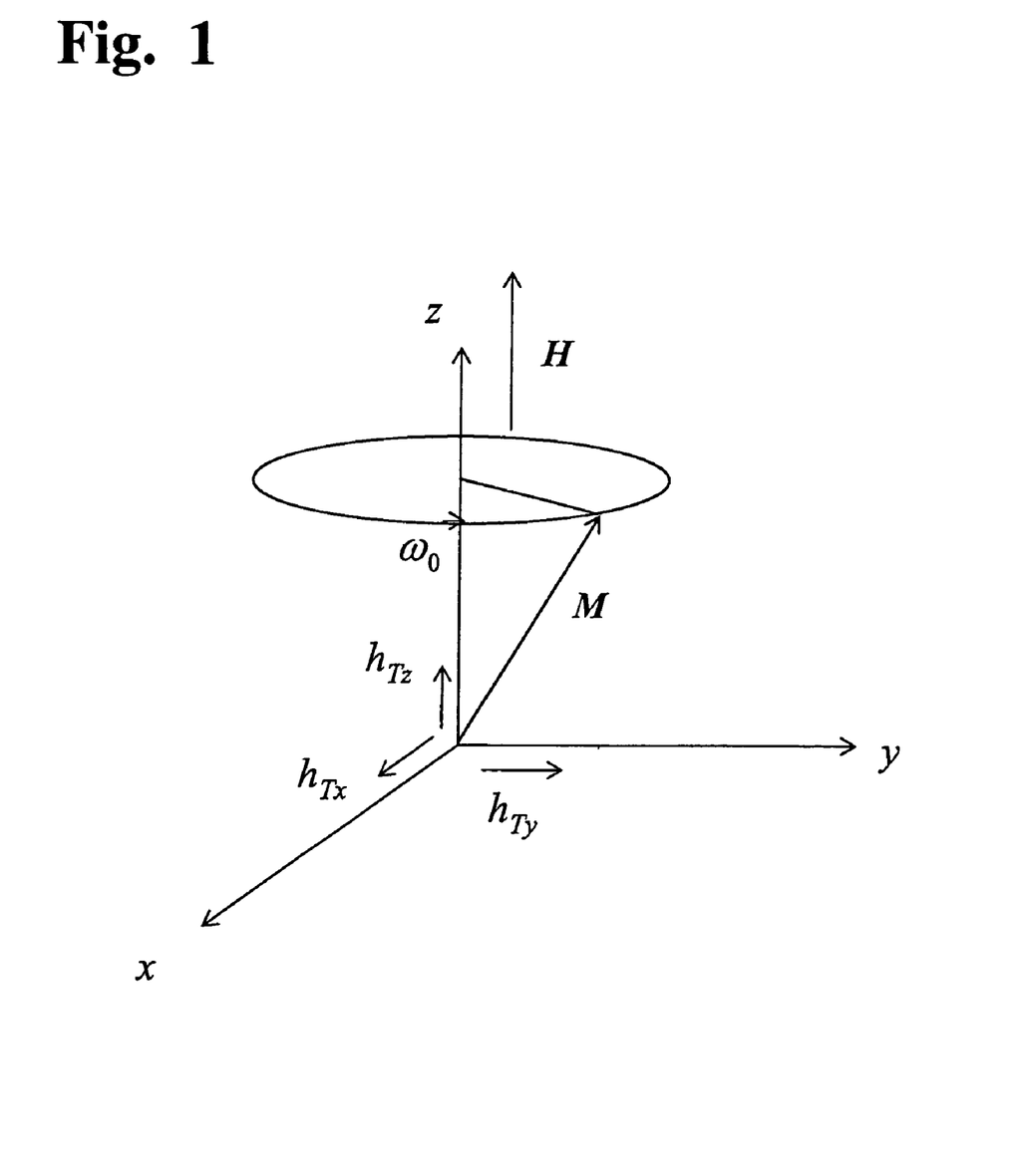
FIG. 1 shows magnetization movement in a state of oscillation.

FIG. 1 shows magnetization movement in a magnetization-oscillation layer oscillating at an oscillation frequency $\omega_0$ in a static magnetic field H. Such spectra have small oscillation line widths when the junction is uniform and thermally oscillating magnetic fields $h_{Ti}$ are small. But the oscillation line width increase with increase in $h_{Ti}$. There are two factors in the increase in the oscillation line widths attributable to the magnetic fields $h_{Ti}$. The first factor is, a spectral line width resulting from magnetic loss, with which thermally oscillating magnetic fields $h_{Tx}$ and $h_{Ty}$ perpendicular to the static magnetic field H in FIG. 1 are involved. The second factor is, a spectral line width resulting from magnetic field dependence of oscillation frequency $f_0$, with which the thermally oscillating magnetic field $h_{Tz}$ in direction H is involved. It is known that the line width Δf attributable to the first factor is approximated by Expression 2.

$$\Delta f = 2\gamma \frac{\alpha kT}{MV} \frac{1}{<m_x^2>} \quad \text{Expression 2}$$

where $m_x$=Mx/M and $M_x$ represent the x-component of magnetization. Since the line width is inversely proportional to the mean square $<m_x^2>$ of the oscillation amplitude similarly to the phase noise of an electron oscillator, the oscillation line width is smaller, the stronger the excitation. As apparent from Expression 2, the smaller the oscillation line width, the greater the volume V of the magnetization-oscillation layer. Oscillation line width $\Delta f_z$ attributable to the second factor is given by Expression 3. The band width B gives frequencies that the magnetization of the magnetization oscillation layer can follow, and it is on the order of 100 GHz in the case of an ordinary ferromagnetic film.

$$\Delta f_z = \frac{df_0}{dH}\sqrt{<h_{Tz}^2>} = \frac{df_0}{dH}\sqrt{\frac{4\alpha kT}{\gamma MV}B} \quad \text{Expression 3}$$

As apparent from Expression 3, the smaller the oscillation line width $\Delta f_z$, the greater the volume V of the magnetization oscillation layer.

Figure 2:
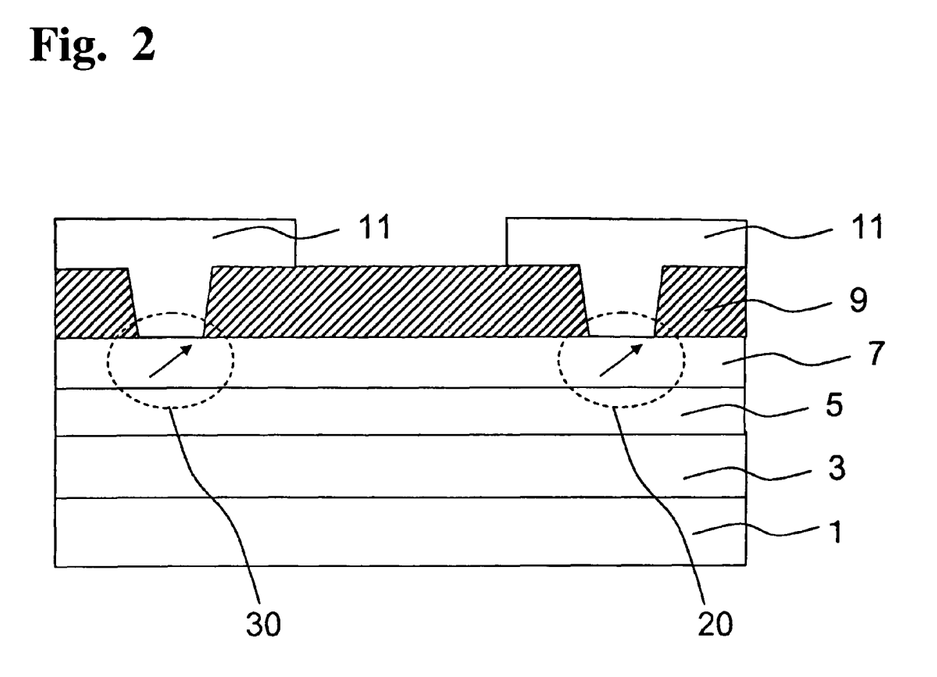
FIG. 2 shows a configuration of a magnetic sensor in a first mode.

FIG. 2 shows a sectional view of a magnetic sensor according to the first mode. A fixed magnetization layer 3 having a fixed direction of magnetization, a non-magnetic layer 5, a magnetization oscillation layer 7, and an insulation layer 9 are formed in this order on a bottom electrode 1, and a pair of top electrodes 11 is provided such that they penetrate through the insulation layer 9 to contact the magnetization oscillation layer 7. The magnetic sensor comprises two magnetic oscillation elements. A first magnetic oscillation element whose oscillation frequency changes as it detects an external magnetic field (hereinafter referred to as a detection part 20). A second magnetic oscillation element oscillating at a frequency different from that of the detection part (hereinafter referred to as a reference part 30). A magnetic multi-layer film constituted by the above described fixed magnetization layer 3, the non-magnetic layer 5, and the magnetization oscillation layer is formed with contact holes. The contact holes (junctions between the top electrodes and the magnetic multi-layer film) have a size on the order of the bit size of a medium, and current can therefore be passed to cause oscillation. The detection part 20 has magnetic field spatial resolution capacity on the order of the contact holes, and the two oscillation elements can interact via spin waves excited in the magnetization oscillation layer around the contact holes.

Figure 3:
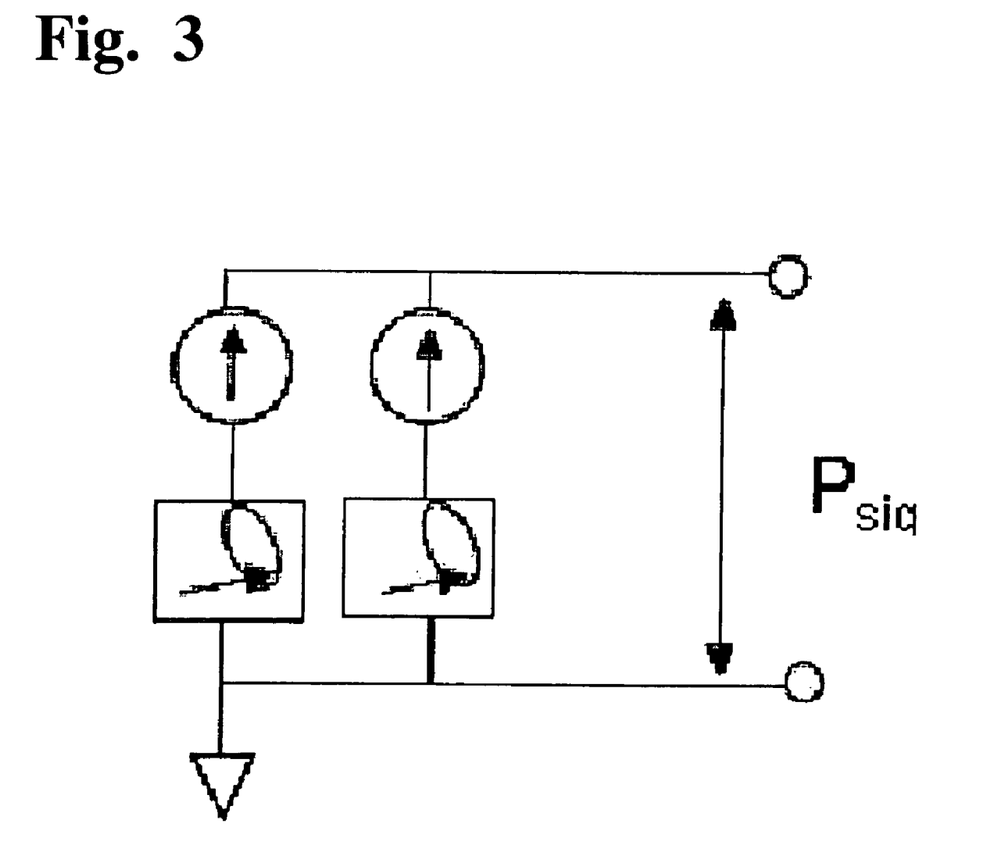
FIG. 3 shows power output from two magnetic oscillation elements in a phase-locked state.

The operation of the magnetic sensor will now be described. When the frequency of the detection part 20 changes due to a magnetic field at the medium so as to agree with the frequency of the reference part 30, the elements enter a phase-locked state in which their magnetization oscillations are synchronized as shown in FIG. 3. The combined oscillation power of the two elements is thus increased about four times greater, which allows the magnetization of the medium to be detected.

Figure 4:
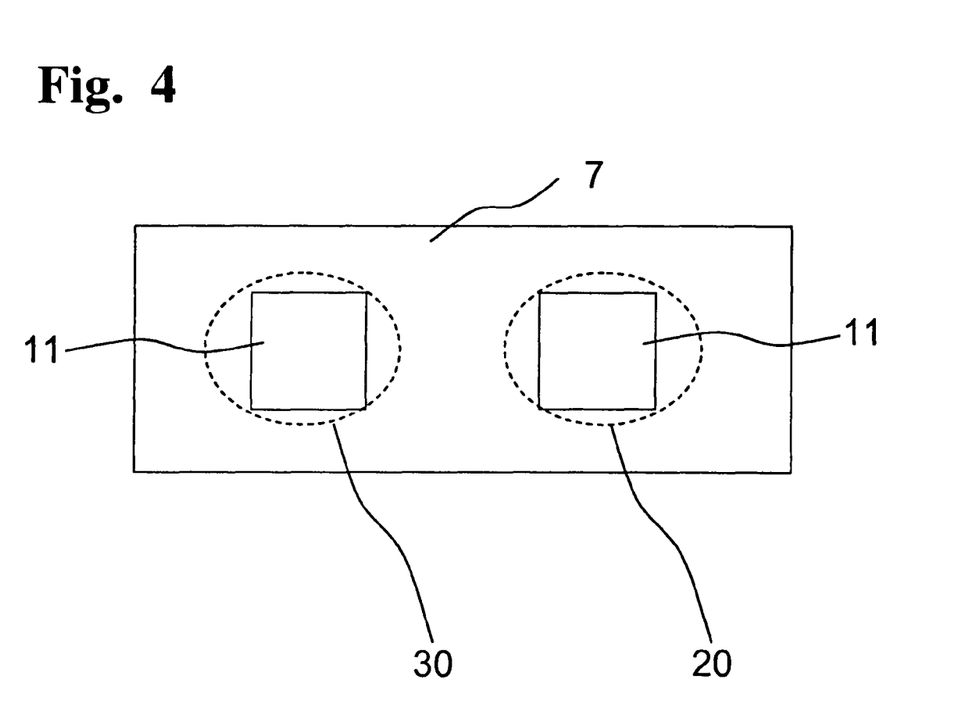
FIG. 4 is a projected view of the magnetic sensor of FIG. 2.

The first advantage of the magnetic sensor according to the invention is that it can be easily processed into a micro structure, because no processing is required on the magnetization oscillation layer in the area of the contact holes. There is no deterioration of the magnetization oscillation layer resulting from processing or complicated magnetic structure attributable to magneto-static energy as described above, and no increase in oscillation line widths attributable to magnetic non-uniformity occurs. The second advantage of the magnetic sensor according to the invention is that the volume of the magnetization oscillation layer contributing to oscillation is effectively increased, because a spin wave is excited also in the area of the magnetization oscillation layer through which no current flows as shown in FIG. 4. As apparent from Expressions 2 and 3, the increase in the volume of the magnetization oscillation layer results in a decrease in oscillation line widths attributable to thermally oscillating magnetic fields. The third advantage of the magnetic sensor according to the invention is that the two oscillation elements are in a phase-locked state under a signal magnetic field from the medium, and oscillation line widths are further reduced in the locked state. Therefore, the magnetic oscillation elements shown in FIG. 2 are low-noise oscillation elements having smaller oscillation line widths compared to oscillation elements in the related art. That means a magnetic sensor having an SN ratio higher than that of magnetic sensors according to the related art can be provided.

Second Mode

Figure 5:
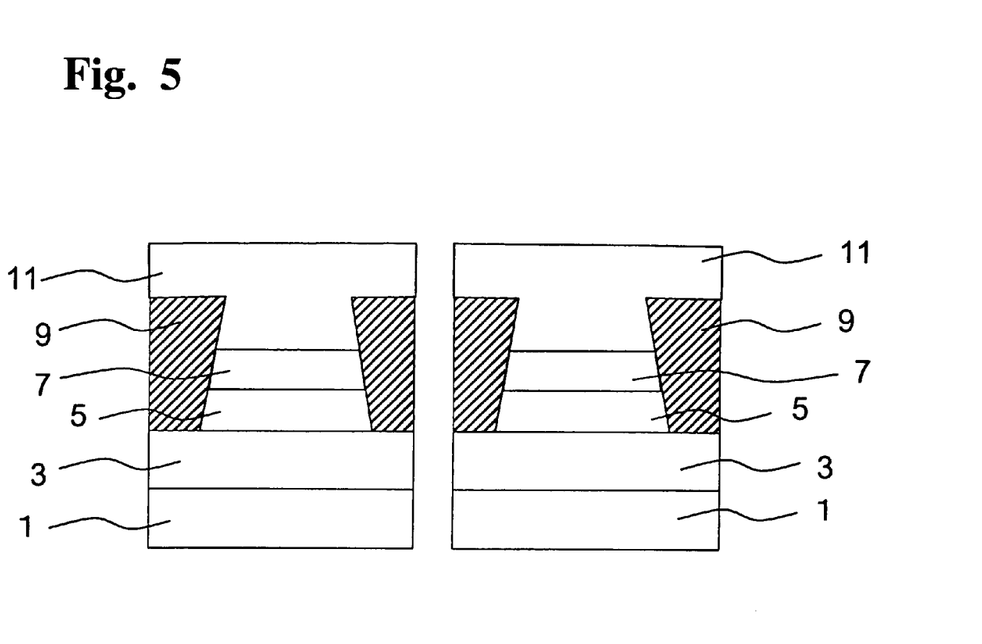
FIG. 5 shows a configuration of a magnetic sensor in a second mode.

The magnetic sensor in the first mode relates to a structure including a magnetization oscillation layer in which a first magnetic oscillation element (detection part 20) and a second magnetic oscillation element (reference part 30) are connected as shown in FIG. 2. However, also in a magnetic sensor having a structure as shown in FIG. 5, in which two oscillation elements have respective magnetization oscillation layers independent from each other, the same advantages can be achieved when the magnetization oscillation layers are close to each other, and there is a strong interaction between them.

MODIFICATIONS OF THE MODES FOR CARRYING OUT THE INVENTION

Modification 1

Figure 6:
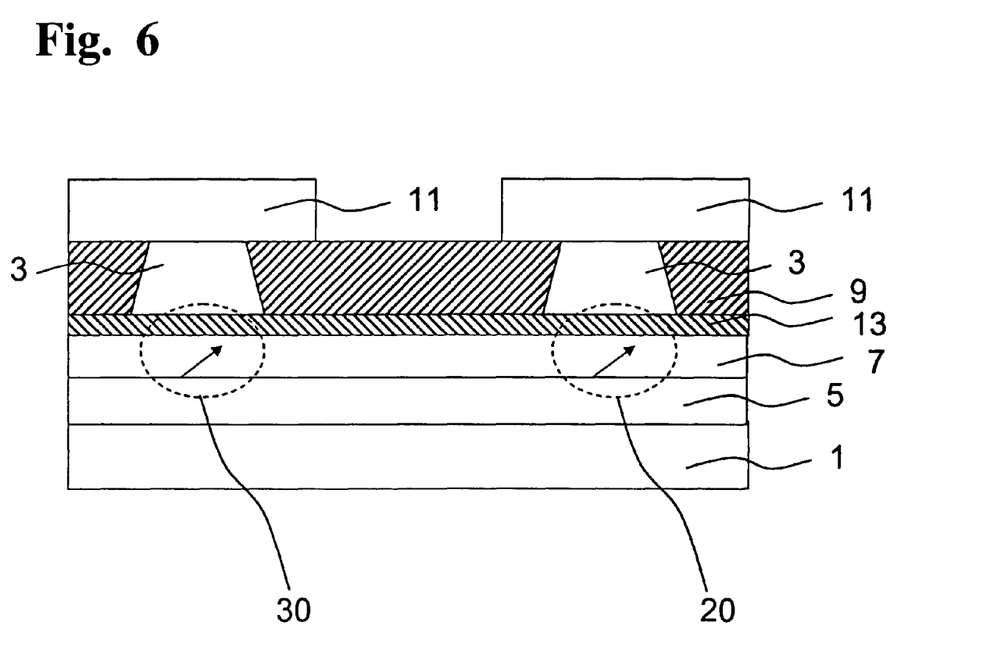
FIG. 6 shows a configuration of a magnetic sensor according to Modification 1 of the mode for carrying out the invention.

The magnetic oscillation elements used in the magnetic sensor of the above-described modes have a basic structure formed by a fixed magnetization layer, a non-magnetic layer, and a magnetization oscillation layer. Alternatively, however, an element as shown in FIG. 6 replacing the non-magnetic layer with an insulation layer to provide a basic structure formed by a fixed magnetization layer, an insulation layer, and a magnetization oscillation layer is possible. A non-magnetic layer 5, a magnetization oscillation layer 7, a tunnel insulation film 13, and an insulation layer 9 are formed in this order on a bottom electrode 1. A pair of fixed magnetization layers 3 is provided such that they penetrate through the insulation layer 9 to contact the insulation film 13, and a top electrode 11 is provided on them. The magnetic sensor comprises two magnetic oscillation elements. A detection part 20 whose oscillation frequency changes as it detects an external magnetic field, and a reference part 30 oscillating at a frequency different from that of the detection part. In the elements shown in FIG. 6, micro-processing is performed on the fixed magnetization layer 3 in order to prevent dispersion of a current by the tunnel insulation film 13.

Modification 2

Figure 7:
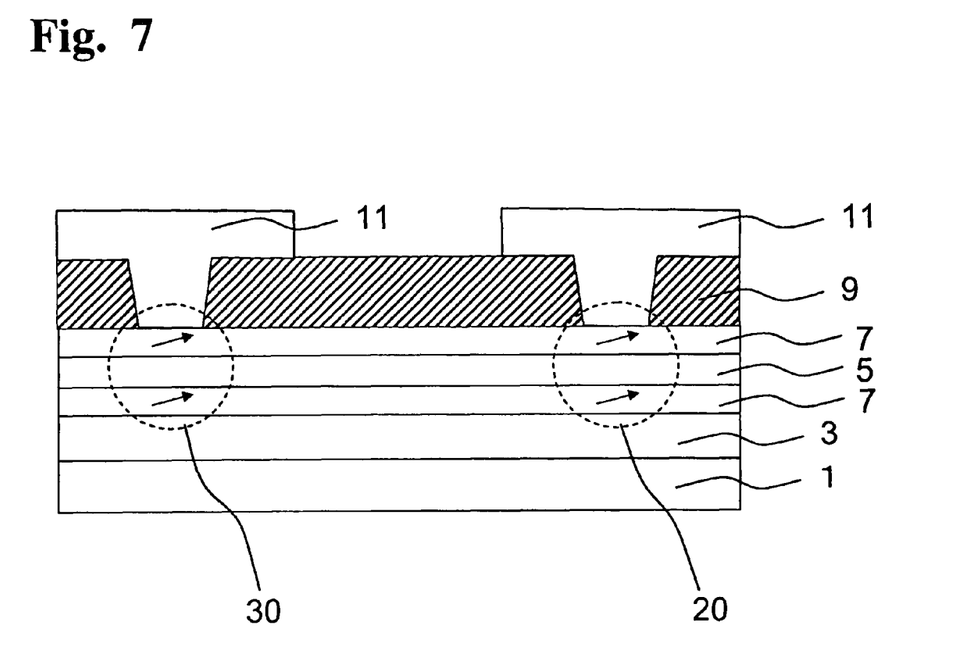
FIG. 7 shows a configuration of a magnetic sensor according to Modification 2 of the mode.

As another modification of the first mode, it is possible to provide an element as shown in FIG. 7 with two magnetization oscillation layers. The basic structure of the element is formed by stacking a magnetization oscillation layer, a non-magnetic layer, and another magnetization oscillation layer. A fixed magnetization layer 3, a non-magnetic layer 5, a magnetization oscillation layer 7, another non-magnetic layer 5, another magnetization oscillation layer 7, and an insulation layer 9 are formed in this order on a bottom electrode 1, and a pair of top electrodes 11 is provided such that they penetrate through the insulation layer 9 to contact the magnetization oscillation layer 7. The magnetic sensor comprises two magnetic oscillation elements. A detection part 20 whose oscillation frequency changes as it detects an external magnetic field, and a reference part 30 oscillating at a frequency different from that of the detection part. It is known that elements as shown in FIG. 7 advantageously reduce magnetic noises to achieve sensitivity to a magnetic field higher than that of existing ordinary oscillation elements.

Modification 3

Figure 8:
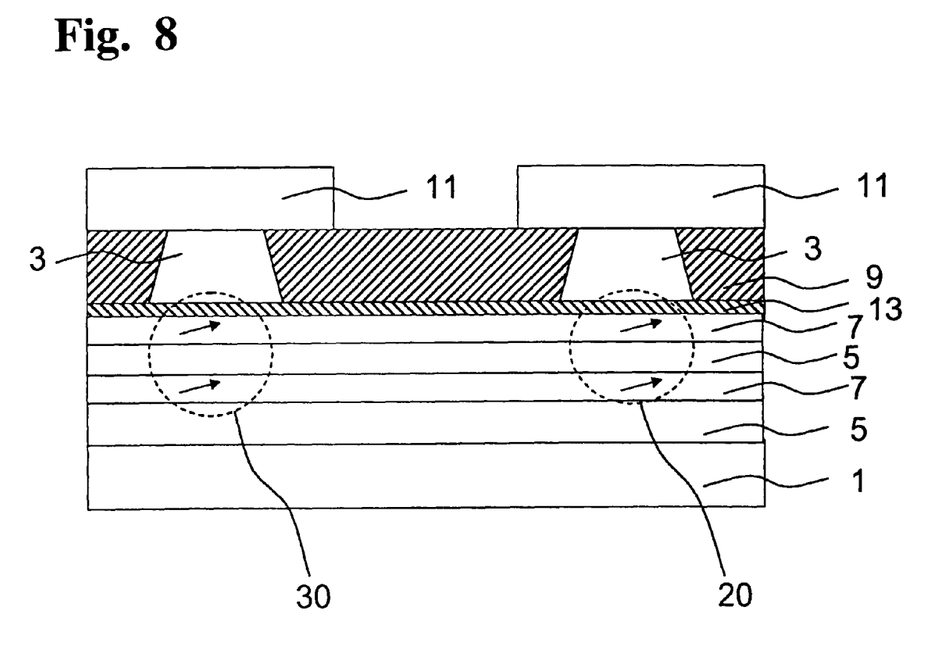
FIG. 8 shows a configuration of a magnetic sensor according to Modification 3 of the mode.

Elements as shown in FIG. 8 obtained by adding an insulation film to elements as shown in FIG. 7 may alternatively be used. A non-magnetic layer 5, a magnetization oscillation layer 7, another non-magnetic layer 5, another magnetization oscillation layer 7, a tunnel insulation film 13, and an insulation layer 9 are formed in this order on a bottom electrode 1. A pair of fixed magnetization layers 3 is provided such that they penetrate through the insulation layer 9 to contact the insulation film 13, and top electrodes 11 are provided on the fixed magnetization layers 3. The magnetic sensor comprises two magnetic oscillation elements. A detection part 20 whose oscillation frequency changes as it detects an external magnetic field, and a reference part 30 oscillating at a frequency different from that of the detection part. It is known that an element as shown in FIG. 8 advantageously reduce magnetic noises to achieve sensitivity to a magnetic field higher than that of existing ordinary oscillation elements.

Other Modification

A normal semiconductor oscillation element provided outside the magnetic sensor may be used instead of a magnetic oscillation element to serve as a reference part. This element may be made to interact with the magnetic oscillation element serving as a detection part through the magnetization oscillation layer of the latter element. These two elements will realize a phase-locked state when the oscillation frequencies of them agree with each other.

EMBODIMENTS

Preferred embodiments of the invention will now be described.

Embodiment 1

Figure 9:
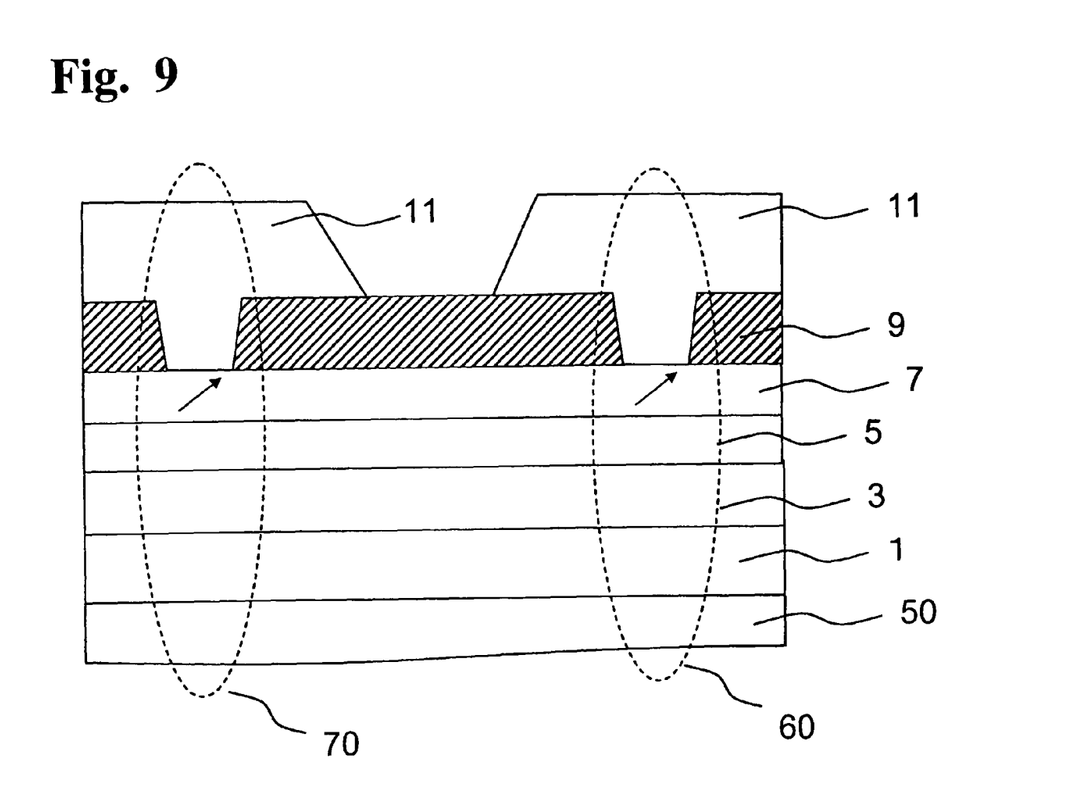
FIG. 9 shows a configuration of a magnetic sensor according to an embodiment of the invention.

FIG. 9 shows a sectional view representing a configuration of a magnetic sensor according to Embodiment 1 of the invention. The magnetic sensor of the present embodiment was fabricated as follows.

A multi-layer film was formed on a silicon substrate 50 by film sputtering and optical and electron beam lithography. A fixed magnetization layer 3 having a fixed direction of magnetization, a non-magnetic layer 5, a magnetization oscillation layer 7, and an insulation layer 9 were formed in this order on a bottom electrode 1, and a pair of top electrodes 11 was provided such that they penetrate through the insulation layer 9 to contact the magnetization oscillation layer 7.

A NiFe film having a thickness of 2 nm was used as the magnetization oscillation layer 7, and a CoFe (10 nm)/IrMn (20 nm) multi-layer film was used as the fixed magnetization layer 3. The magnetization oscillation layer and the fixed magnetization layer were formed in a magnetic field of about 2000 Oe, such that the axes of anisotropy of the NiFe film and the CoFe/IrMn film coincide with each other. A Ta (5 nm)/Cu (300 nm)/Ta (5 nm) multi-layer film was used as the bottom electrode 1 for concentrating current. An Au (50 nm)/Cu (300 nm)/Ta (5 nm) multi-layer film was used as the top electrode 11. A layer of Cu (5 nm) was used as the non-magnetic layer. A layer of SiOx (100 nm) was used as the insulation layer 9. The contact holes had a diameter of 40 nm. The distance between the two contact holes was 200 nm. The length of the whole element was 5 μm. An oscillation element A had a resistance of 18Ω and an MR ratio of 2.5%, and an oscillation element B had a resistance of 19Ω and an MR ratio of 2.3%.

Figure 10:
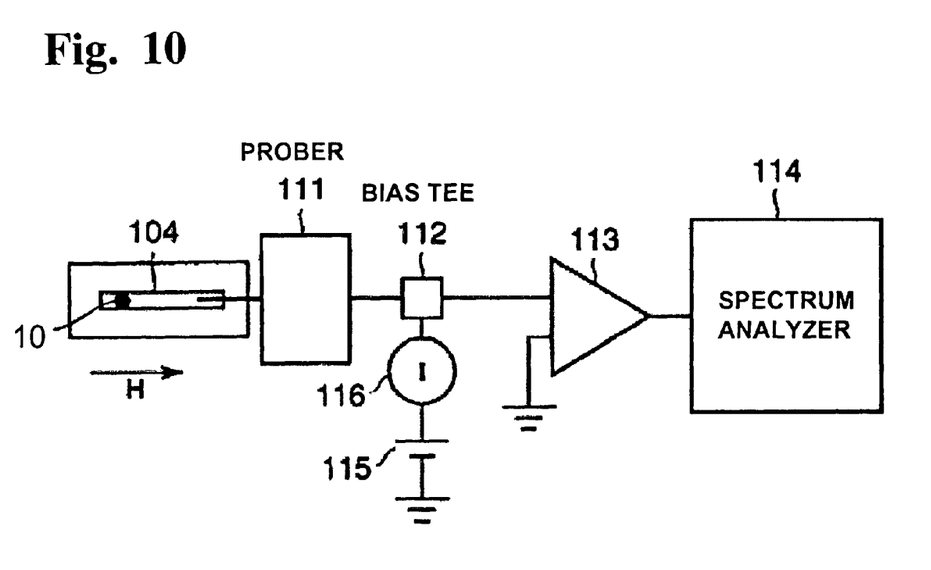
FIG. 10 shows a configuration of a system for measuring oscillation power spectra of magnetic oscillation elements.
Figure 11:
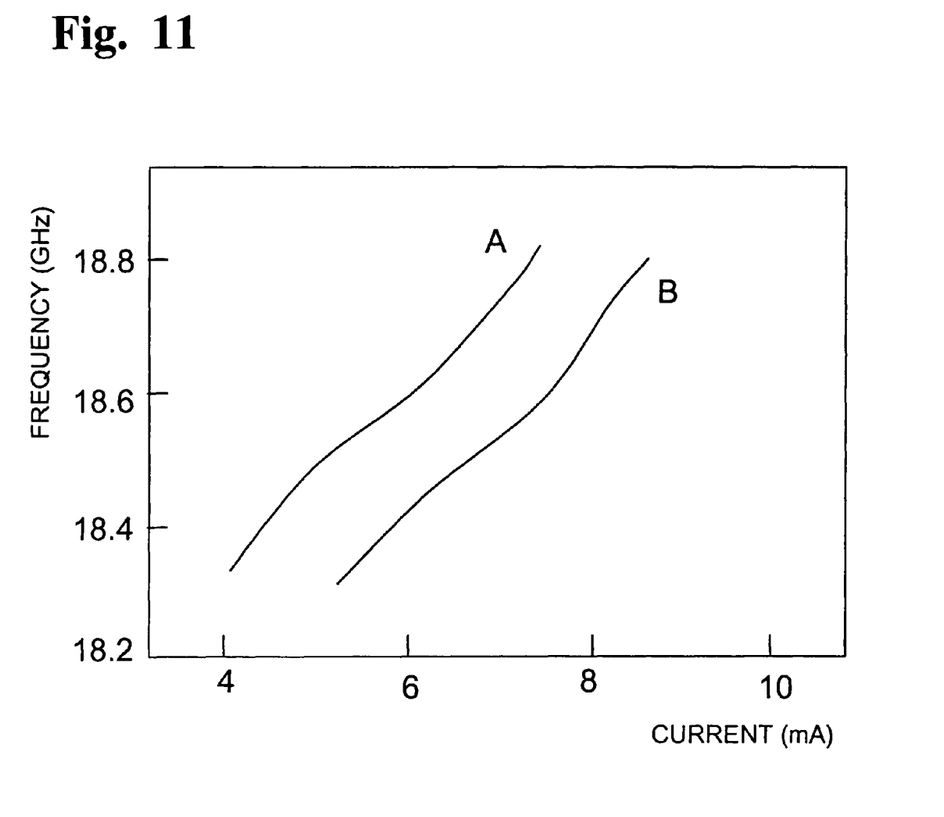
FIGS. 11-13 show current dependence of oscillation frequencies of the magnetic oscillation elements in the embodiment of the invention.
Figure 12:
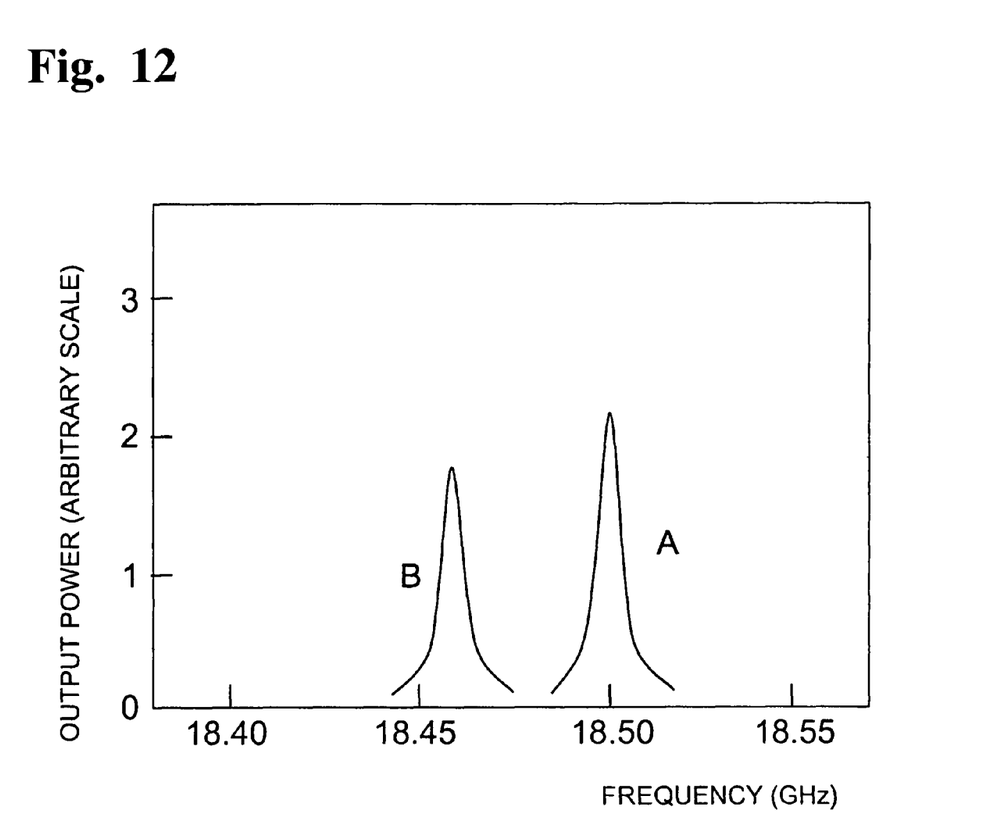
Figure 13:
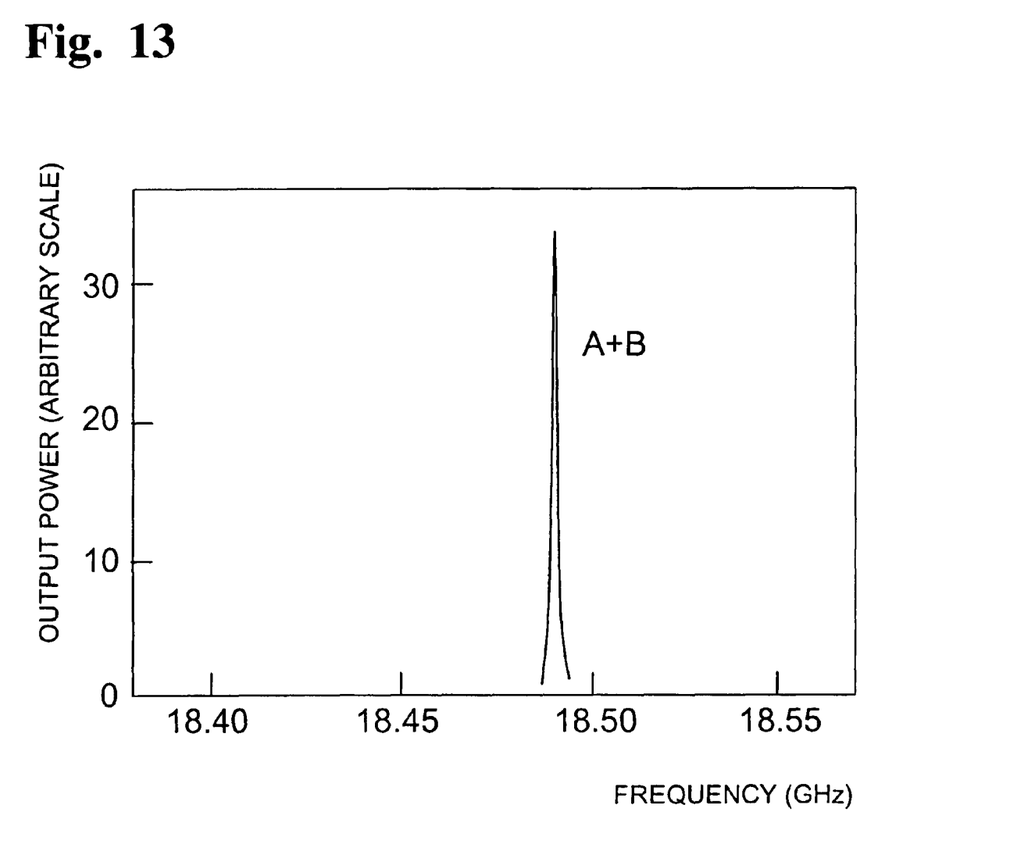

The above-described pair of magnetic oscillation elements was connected to two micro wave strip lines, and the combined output of the element was measured by a spectrum analyzer. FIG. 10 shows a system for measuring oscillation power spectra of the magnetic oscillation elements. A bias tee 112 is connected through a prober 111 to a waveguide 104 (having a characteristic impedance of 50Ω) for transmitting high-frequency oscillation from a magnetic oscillation sensor 10. An input end of an amplifier 113 is connected to an output end of the bias tee 112, and a spectrum analyzer 114 is connected to an output end of the amplifier 113. A voltage source 115 and a current source 116 are connected to bias tee 112. Two bias tees were used to supply a DC current to the elements A and B independently of each other. FIG. 11 shows current dependence of oscillation frequencies in an external magnetic field having an intensity of 500 Oe in the direction of the easy axis thereof. The curves A and B represent the dependence of the elements A and B, respectively, and the measurement was carried out while passing a current though one element only and passing no current through the other element. FIG. 12 shows output spectra obtained when currents of 5 mA and 6.3 mA were then passed through the elements A and B, respectively. Oscillation peaks were observed at 18.46 GHz corresponding to oscillation of the element B, and at 18.50 GHz corresponding to oscillation of the element A, which indicated that the two oscillation elements were not phase-locked. It is desirable that the difference of the oscillation frequency of the element A and B is less than 1 GHz. The external field intensity was subsequently increased to 100 Oe with the currents passed through the elements kept unchanged. In this case, the two oscillation elements phase-locked, and the spectra changed into one peak as shown in FIG. 13. Both of the elements A and B have a spectral width of about 10 MHz in FIG. 12, but the spectral width is reduced to about 2 MHz in FIG. 13. The total oscillation output in the phase-locked state was about four times greater than that in the non-phase-locked state.

As described above, according to the present embodiment, a magnetic field in a microscopic region can be detected without processing a magnetic multi-layer film into a pillar-like shape, and a magnetic sensor having a high SN ratio can be provided by taking advantage of a phase-locked state between two oscillation elements.

Figure 14:
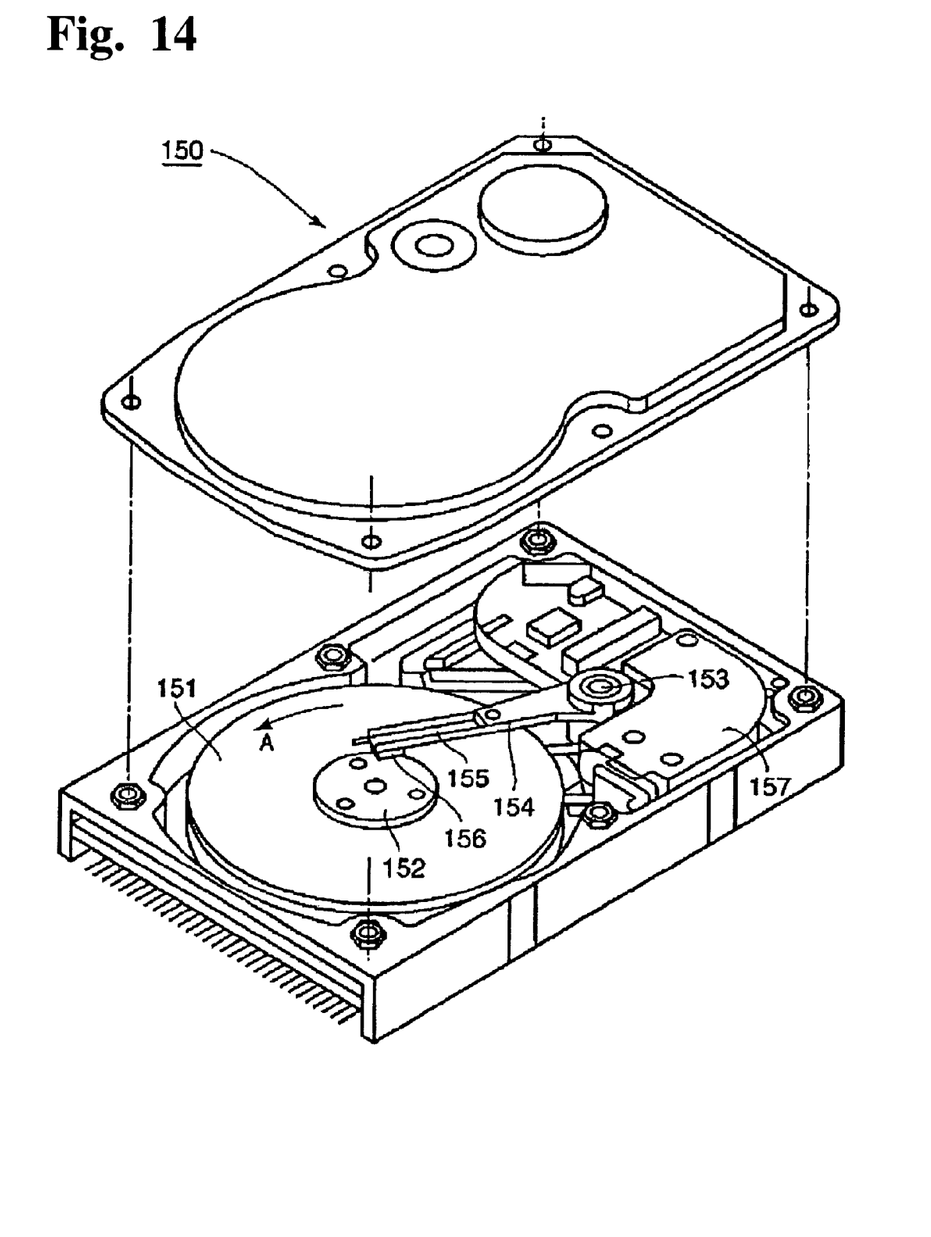
FIG. 14 is a perspective view of a magnetic recording/reproducing apparatus utilizing the magnetic sensor.

FIG. 14 shows a perspective view of a magnetic recording/reproducing apparatus 150 according to the modes for carrying out the invention. A magnetic disk (magnetic recording medium) 151 is rotated in the direction indicated by the arrow A by a spindle motor attached to a spindle 152. An actuator arm 154 is held on a pivot 153 provided in the vicinity of the magnetic disk 151. A suspension 155 is mounted on the tip of the actuator arm 154. A head slider 156 is supported on the bottom of the suspension 155. The head slider 156 carries a magnetic head including a magnetic sensor as described above. A voice coil motor 157 is formed at the base end of the actuator arm 154.

The magnetic disk 151 is rotated, and the actuator arm 154 is rotated by the voice coil motor 157 to load the head slider 156 on the magnetic disk 151. Then, a medium facing surface (ABS) of the head slider 156 carrying the magnetic head is held at a predetermined floating height from the surface of the magnetic disk 151. In this state, information recorded on the magnetic disk 151 can be read based on the above-described principle.

Obviously many modifications and variations of the present invention are possible in the light of the above teachings. It is therefore to be understood that within the scope of the appended claims in the invention may be practiced otherwise than as specifically described.

What is claimed is:

1. A magnetic sensor comprising:
   (a) a magnetic oscillation element whose oscillation frequency changes depending on the magnitude of an external magnetic field having:
      a first fixed magnetization layer whose magnetization is fixed;
      a first magnetization oscillation layer;
      a first non-magnetic layer provided between the first fixed magnetization layer and the first magnetization oscillation layer; and
      a pair of electrodes for passing current perpendicularly to the film surfaces of the first fixed magnetization layer, the first magnetization oscillation layer, and the first non-magnetic layer; and
   (b) an oscillation element, provided in the vicinity of the magnetic oscillation element, for oscillating at an oscillation frequency close to the oscillation frequency of the magnetic oscillation element,
   wherein the current is applied to acquire a high frequency oscillation signal generated from the magnetic oscillation element and the oscillation element.

2. The magnetic sensor according to claim 1, wherein the oscillation element is a magnetic oscillation element comprising:

a second fixed magnetization layer whose magnetization is fixed;

a second magnetization oscillation layer;

a second non-magnetic layer provided between the second fixed magnetization layer and the second magnetization oscillation layer; and a pair of electrodes for passing current perpendicularly to the film surfaces of the second fixed magnetization layer, the second magnetization oscillation layer, and the second non-magnetic layer.

3. The magnetic sensor according to claim 2, wherein the first and second magnetization oscillation layers are connected each other.

4. The magnetic sensor according to claims 2, wherein the first or second magnetization oscillation layer or both is a multi-layer film including a magnetization oscillation layer, a non-magnetic layer, and another magnetization oscillation layer.

5. A magnetic sensor according to claims 2, wherein the first or second non-magnetic layer or both is an insulation layer.

6. A magnetic recording/reproducing apparatus comprising:

a magnetic head including a magnetic sensor according to any of claims 1 to 5; and a magnetic recording medium.

* * * * *